United States Patent
Lai

(10) Patent No.: US 9,202,818 B1
(45) Date of Patent: Dec. 1, 2015

(54) METHOD FOR MANUFACTURING THREE DIMENSIONAL STACKED SEMICONDUCTOR STRUCTURE AND STRUCTURE MANUFACTURED BY THE SAME

(71) Applicant: Macronix International Co., Ltd., Hsinchu (TW)

(72) Inventor: Erh-Kun Lai, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/277,854

(22) Filed: May 15, 2014

(51) Int. Cl.
*H01L 21/3205* (2006.01)
*H01L 27/115* (2006.01)
*H01L 27/108* (2006.01)

(52) U.S. Cl.
CPC .... *H01L 27/11582* (2013.01); *H01L 27/11578* (2013.01); *H01L 27/10844* (2013.01)

(58) Field of Classification Search
CPC .................. H01L 27/11578; H01L 27/10844
See application file for complete search history.

(56) References Cited

U.S. PATENT DOCUMENTS

| 2010/0207194 A1* | 8/2010 | Tanaka et al. | 257/324 |
| 2012/0052674 A1* | 3/2012 | Lee et al. | 438/591 |
| 2012/0064682 A1* | 3/2012 | Jang et al. | 438/268 |
| 2014/0048868 A1* | 2/2014 | Kim et al. | 257/324 |

OTHER PUBLICATIONS

Jang, et al.: "Vertical Cell Array using TCAT(Terabit Cell Array Transistor) Technology for Ultra High Density NAND Flash Memory"; 2009 Symposium on VLSI Technology Digest of Technical Papers; pp. 192-193.
Ishiduki, et al.: "Optimal Device Structure for Pipe-shaped BiCS Flash Memory for Ultra High Density Storage Device with Excellent Performance and Reliability"; 97/4244-5640-6/09/$26.00 © 2009 IEEE; pp. 27.3.1-273.4.

\* cited by examiner

*Primary Examiner* — Thao X Le
*Assistant Examiner* — Laura Dykes
(74) *Attorney, Agent, or Firm* — McClure, Qualey & Rodack, LLP

(57) ABSTRACT

A method of manufacturing a three-dimensional (3D) stacked semiconductor structure is provided, comprising. A multi-layer on a substrate is formed, and the multi-layer comprises plural first dielectric layers and second dielectric layers arranged alternately. The multi-layer is then patterned to form plural first patterned stacks and spaces between the first patterned stacks, wherein one of the first patterned stacks has a width of F0 while the one of the spaces has a width of Fs. In one embodiment, F0 is equal to or more than 2 times Fs. Parts of the second dielectric layers of one of the first patterned stacks are removed, so as to form plural first cavities in the first patterned stack. Then, the first cavities in the first patterned stack are filled with conductors.

9 Claims, 13 Drawing Sheets

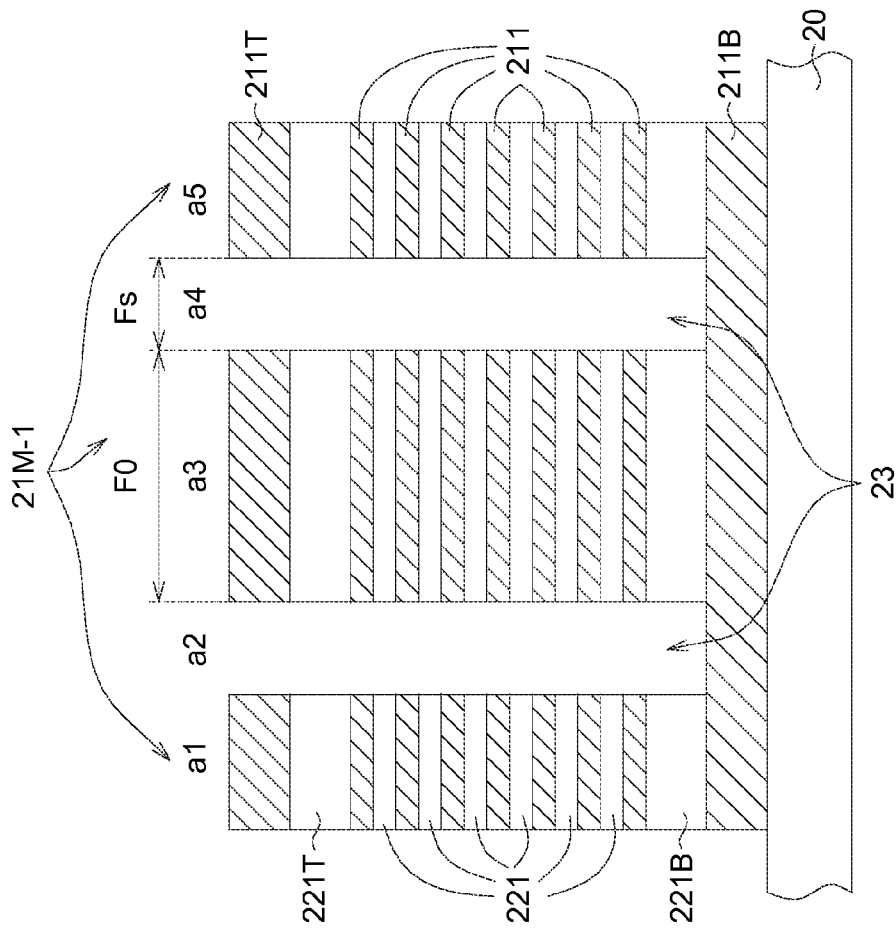
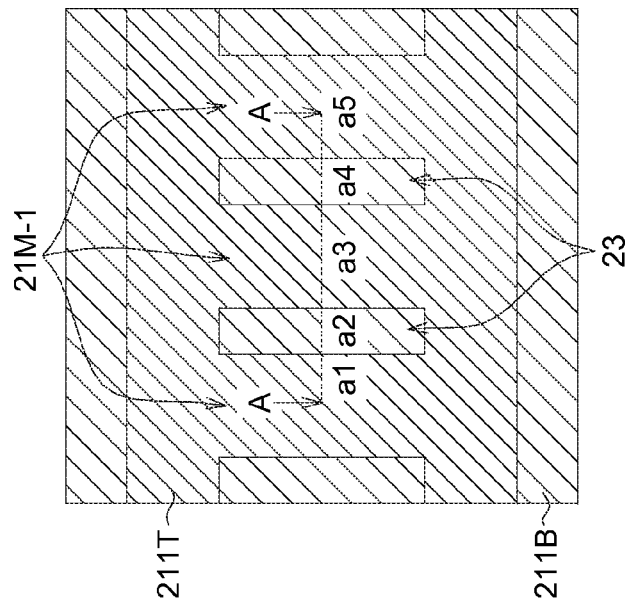
FIG. 3B
FIG. 3A

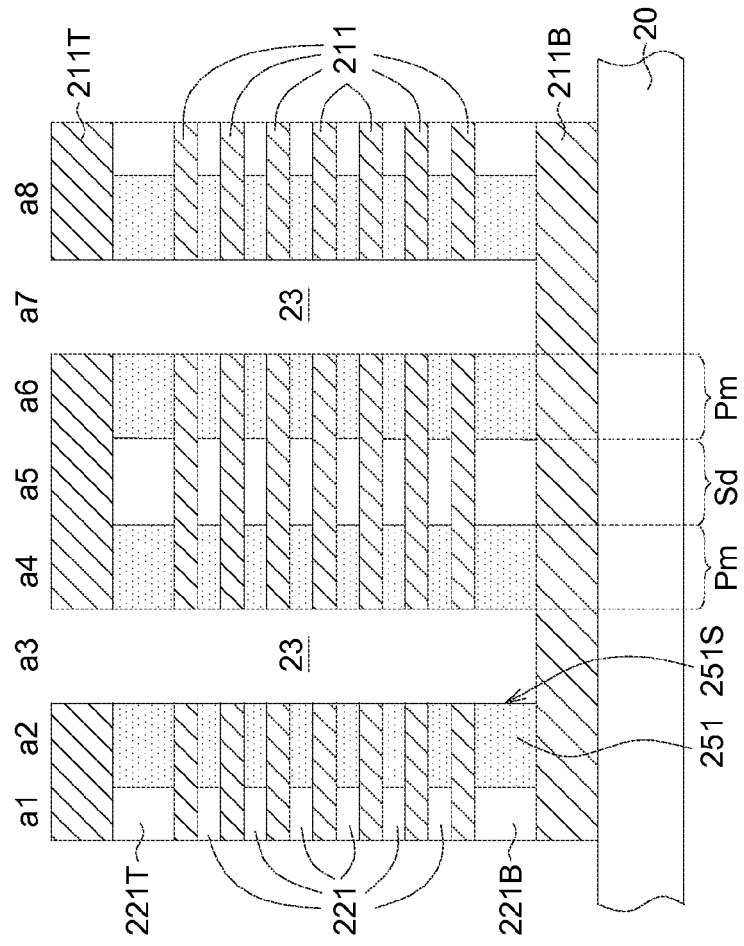
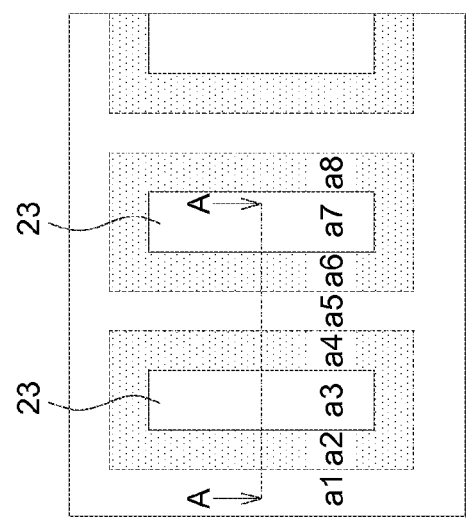
FIG. 6B
FIG. 6A

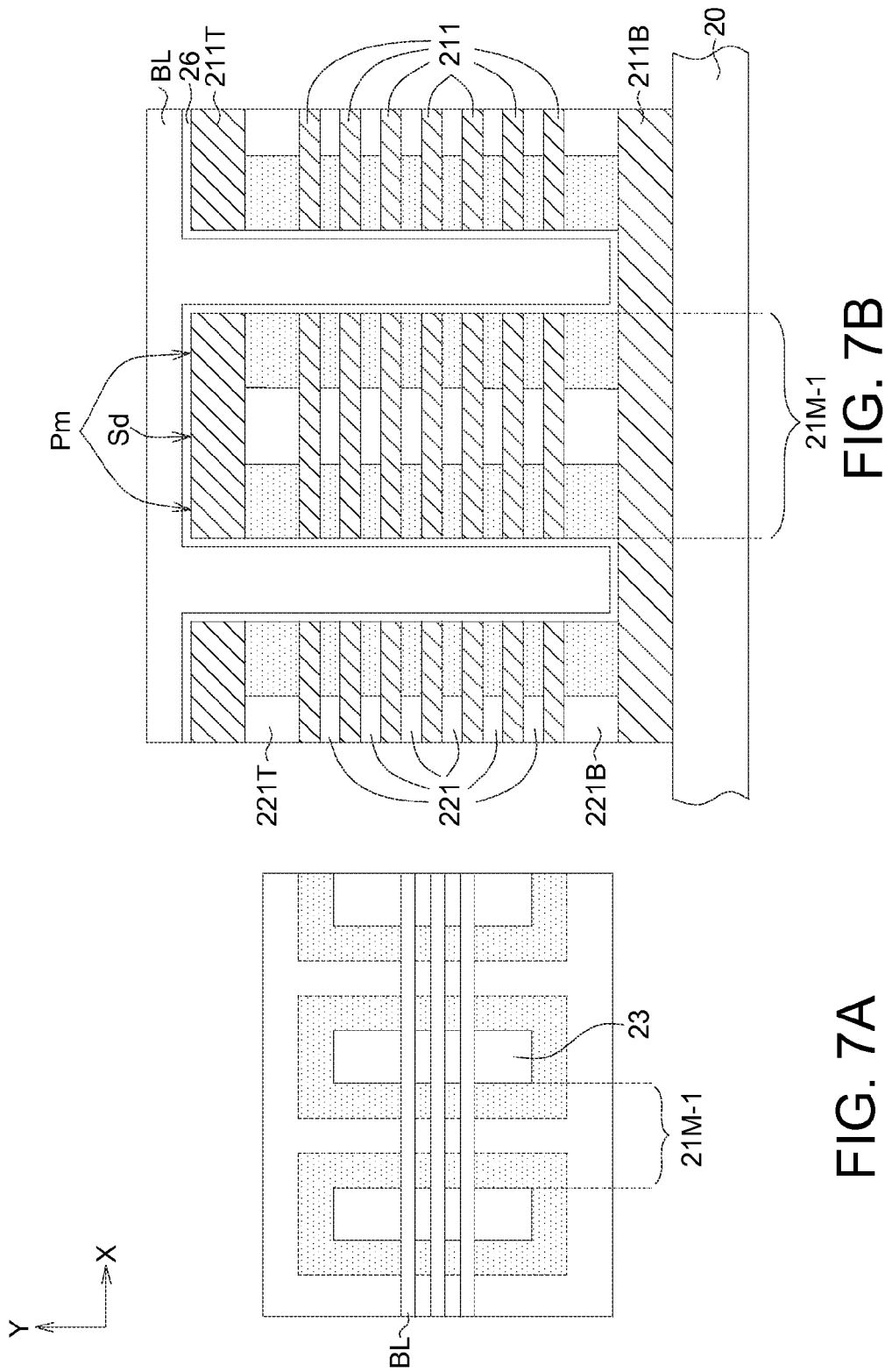

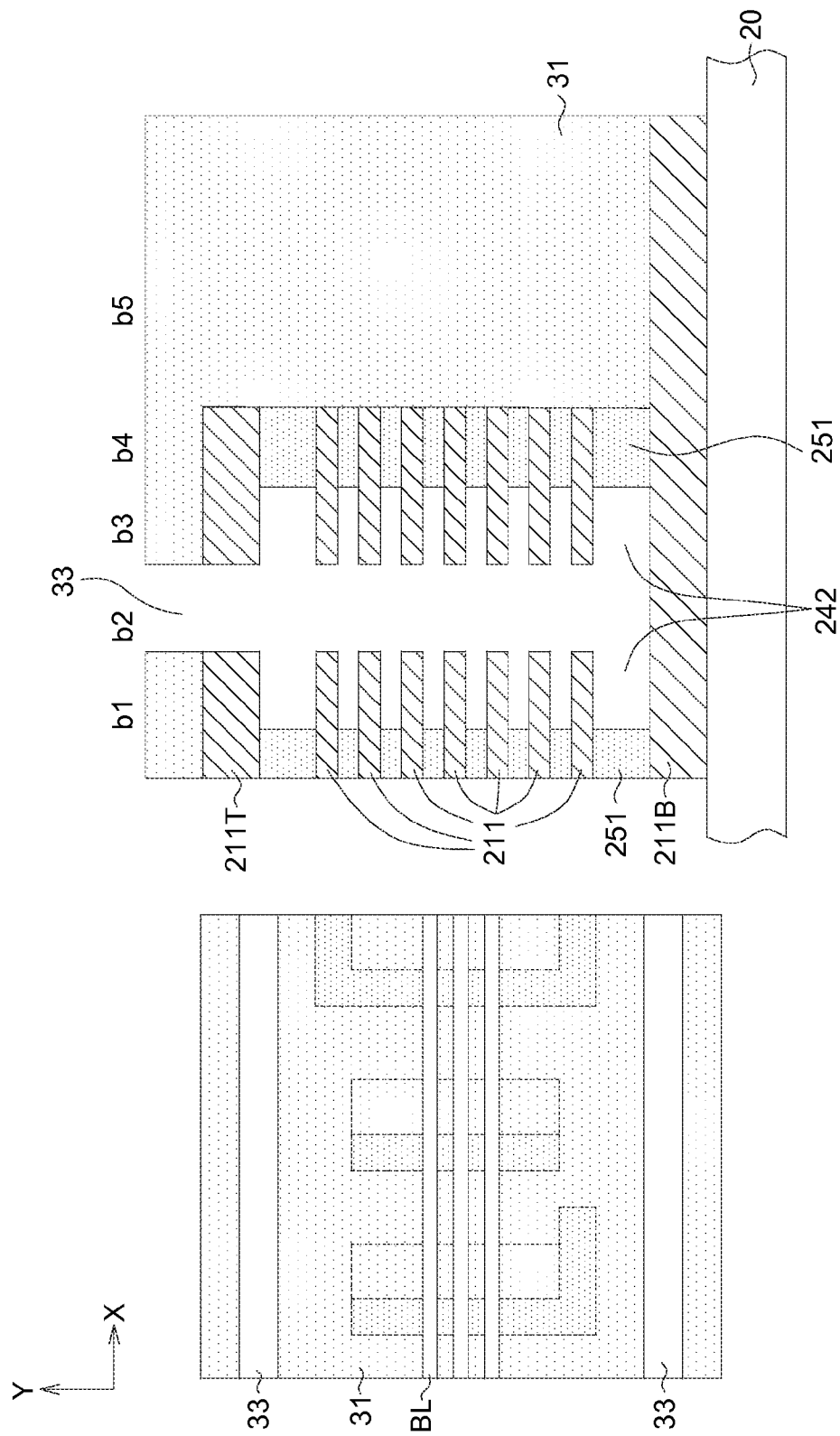

METHOD FOR MANUFACTURING THREE DIMENSIONAL STACKED SEMICONDUCTOR STRUCTURE AND STRUCTURE MANUFACTURED BY THE SAME

BACKGROUND

1. Field of the Invention

The disclosure relates in general to a method of manufacturing a three-dimensional (3D) stacked semiconductor structure and a structure manufactured by the same, and more particularly to the method for manufacturing the structure having dielectric supports for multi-layered pillars, thereby strengthening the overall construction.

2. Description of the Related Art

A nonvolatile semiconductor memory device is typically designed to securely hold data even when power is lost or removed from the memory device. Various types of nonvolatile memory devices have been proposed in the related art. Also, manufactures have been looking for new developments or techniques combination for stacking multiple planes of memory cells, so as to achieve greater storage capacity. For example, several types of multi-layer stackable NAND-type flash memory structures have been proposed. However, the typical 3D memory structure suffers from several problems.

For the conventional 3D stacked semiconductor structure and manufacturing method, the easily bended or collapsed problems occurred often due to higher aspect ratio. FIG. 1 schematically shows the bended pillars occurred in the conventional 3D stacked semiconductor structure. It has been studied that the structure deformation of the pillar is related to the height H and the width L of pillar. In FIG. 1, $\gamma$ represents surface tension, E represents Young modulus, and $\delta$ represents structure deformation, wherein $$\delta = 3\gamma \cos\theta \frac{H^4}{dEL^3}.$$

If the pillars of the 3D stacked semiconductor structure are tall and narrow, it is easily bended or collapsed.

Also, the multi-layered pillars of the 3D stacked semiconductor structure are oxide-and-polysilicon (O-P) stacks, which exhibit unbalanced stress, and are easily collapsed or bended during manufacturing processes. Furthermore, the oxide is dielectric and polysilicon is conductor, and the vertical sidewalls of the O-P stack shows a zig-zag profile, which may have considerable effects on the electrical properties of the 3D stacked semiconductor structure.

SUMMARY

The disclosure relates to a method of manufacturing a three-dimensional (3D) stacked semiconductor structure and a structure manufactured by the same. According to the method of the embodiment, a multi-layer comprising plural first dielectric layers (compressive) and second dielectric layers (tensile) arranged alternately is formed and followed by patterning steps. The method of the embodiment solves easy-to-bended and/or collapsed problem occurring in the stacking and patterning procedures for manufacturing the conventional stacked semiconductor structure. According to the structure of the embodiment, a dielectric support Sd is formed between two adjacent multi-layered pillars for strengthening the overall construction, thereby providing a self-aligned profile and the reliable electrical characteristics.

According to one embodiment of the present disclosure, a method of forming 3D stacked semiconductor structure is provided, comprising:

forming a multi-layer on a substrate, and the multi-layer comprising a plurality of first dielectric layers and second dielectric layers arranged alternately;

patterning the multi-layer to form a plurality of first patterned stacks and spaces between the first patterned stacks, wherein one of the first patterned stacks has a width of F0 while the one of the spaces has a width of Fs, and F0 is equal to or more than 2 times Fs (In one embodiment, F0 is 3 times of Fs. (F0/Fs=3));

removing parts of the second dielectric layers of one of the first patterned stacks, so as to form a plurality of first cavities in said first patterned stack; and filling the first cavities in said first patterned stack with first conductors.

According to one embodiment of the present disclosure, a 3D stacked semiconductor structure is provided, at least comprising a plurality of first patterned stacks formed on a substrate and spaces between the first patterned stacks, and a pad region outside the first patterned stacks and electrically connected to the multi-layered pillars. In one embodiment, one of the first patterned stacks comprises two multi-layered pillars and a dielectric support sandwiched between the two multi-layered pillars. Each of the multi-layered pillars comprises a plurality of first dielectric layers and a plurality of first conductors arranged alternately. The dielectric support comprises the first dielectric layers and a plurality of second dielectric layers arranged alternately. Also, the first patterned stacks extend along a first direction (such as y-direction), and the pad region extends along a second direction (such as x-direction) perpendicular to the first direction.

The disclosure will become apparent from the following detailed description of the preferred but non-limiting embodiments. The following description is made with reference to the accompanying drawings.

BRIEF DESCRIPTION OF THE DRAWINGS

FIG. 2A~FIG. 6A and FIG. 2B~FIG. 6B illustrate a method for manufacturing a 3D stacked semiconductor structure according to an embodiment of the present disclosure.

FIG. 7A and FIG. 7B illustrate the charge-trapping layer and the bit lines manufactured by the method according to an embodiment of the present disclosure.

FIG. 8A~FIG. 12A and FIG. 8B~FIG. 12B illustrate a method for manufacturing a 3D stacked semiconductor structure with pad regions according to an embodiment of the present disclosure.

DETAILED DESCRIPTION

Figure 1:
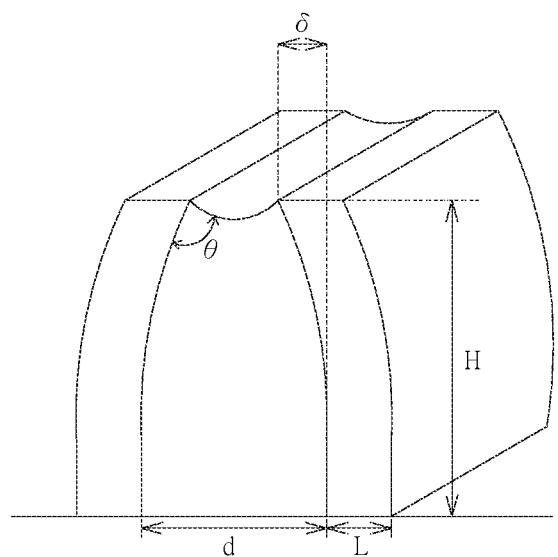
FIG. 1 schematically shows the bended pillars occurred in the conventional 3D stacked semiconductor structure.

In the embodiments of the present disclosure, a method of manufacturing a three-dimensional (3D) stacked semiconductor structure and a structure manufactured by the same are provided. According to the method of the embodiment, a multi-layer comprising a plurality of first and second dielectric layers arranged alternately are formed on a substrate, followed by patterning the multi-layer to form a plurality of first patterned stacks and spaces between the first patterned stacks. According to the embodiment, the first dielectric layers are compressive layers exhibiting compressive stress, and the second dielectric layers are tensile layers exhibiting tensile stress. Parts of the second dielectric layers of one of the first patterned stacks are then replaced by conductors. The 3D stacked semiconductor structure manufactured by the method of the embodiment has plural multi-layered patterned stacks and spaces between the multi-layered patterned stacks, and each patterned stack comprises a dielectric support sandwiched between two multi-layered pillars.

The method of the embodiment solves easy-to-bended and/or collapsed problem occurring in the stacking and patterning procedures for manufacturing the conventional stacked semiconductor structure. Also, the method of the embodiment provides a self-aligned process, and vertical sidewalls of the multi-layered pillars of the patterned stacks can be obtained. The method of the embodiment is especially suitable for manufacturing the 3D stacked semiconductor structure with high and thin patterned multi-layered pillars, and the structure of the embodiments possesses a solid construction (due to the dielectric support between two multi-layered pillars providing physical support), a self-aligned profile, and reliable electrical characteristics. Furthermore, the 3D stacked semiconductor structure of the embodiments are manufactured by simple process, and adopting no time-consuming and expensive procedures.

The embodiment of the present disclosure could be implemented in many different 3D stacked semiconductor structures in the applications. For example, the embodiment could be applied to, but not limited to, the 3D vertical-channel semiconductor devices, such as applied to the 3D double gate vertical-channel (DGVC) and IDGVC (independent double gate vertical-channel) semiconductor devices. The embodiments are provided hereinafter with reference to the accompanying drawings for elaborating the method of manufacturing the 3D stacked semiconductor structure of the disclosure and the structure manufactured by the same. However, the present disclosure is not limited thereto. The descriptions disclosed in the embodiments of the disclosure such as detailed structures, manufacturing procedures and material selections are for illustration only, not for limiting the scope of protection of the disclosure.

Also, it is noted that not all embodiments of the invention are shown. Modifications and variations can be made without departing from the spirit of the disclosure to meet the requirements of the practical applications. Thus, there may be other embodiments of the present disclosure which are not specifically illustrated. It is also important to point out that the illustrations may not be necessarily be drawn to scale. Thus, the specification and the drawings are to be regard as an illustrative sense rather than a restrictive sense.

FIG. 2A~FIG. 6A and FIG. 2B~FIG. 6B illustrate a method for manufacturing a 3D stacked semiconductor structure according to an embodiment of the present disclosure. Figures labeled with A such as FIGS. 2A, 3A, . . . 6A show the top views of the 3D stacked semiconductor structure. Figures labeled with B such as FIGS. 2B, 3B, . . . 6B illustrate cross-sectional views along the cross-sectional lines AA of FIGS. 2A~6A, respectively. The position of the cross-sectional line AA is corresponding to the regions of the patterned stacks and spaces there between.

Figure 2A:
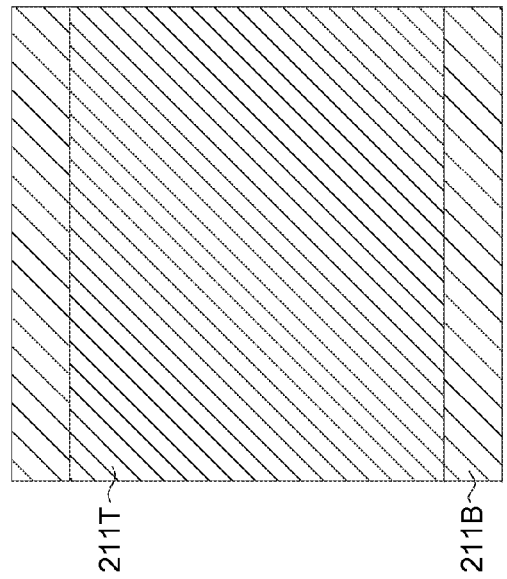
Figure 2B:
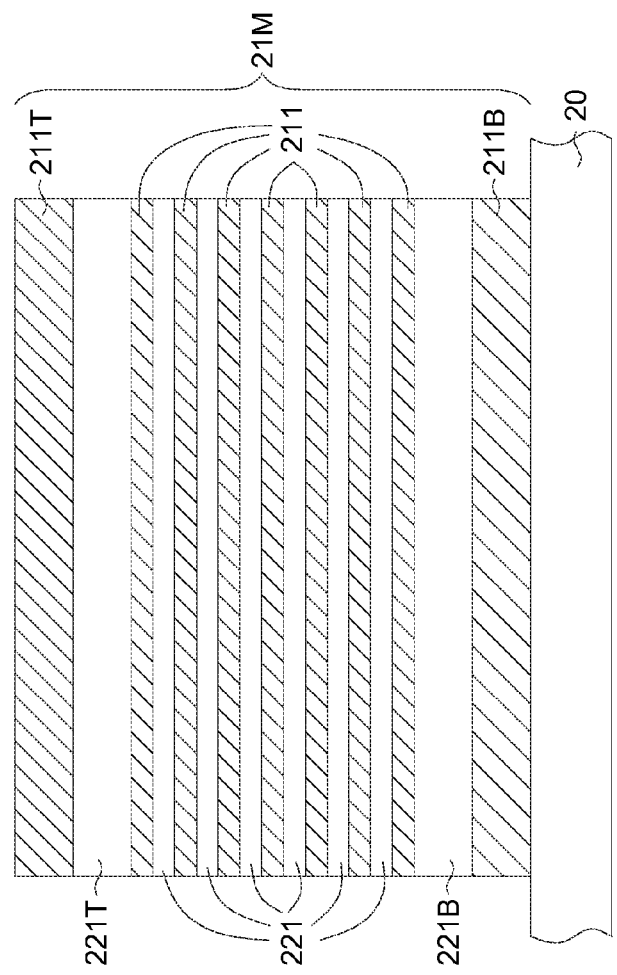

As shown in FIG. 2A and FIG. 2B, a multi-layer 21 is formed on a substrate 20, and the multi-layer comprising a plurality of first dielectric layers 211, 211B (a bottom layer of the first dielectric layers) and 211T (a top layer of the first dielectric layers), and a plurality of second dielectric layers 221, 221B (a bottom layer of the second dielectric layers) and 221T (a top layer of the second dielectric layers) arranged alternately.

According to the embodiment, the first dielectric layers 211, 211B and 211T are compressive layers exhibiting compressive stress, and the second dielectric layers 221, 221B and 221T are tensile layers exhibiting tensile stress. In one embodiment, the first dielectric layers 211, 211B and 211T are a plurality of oxide layers, and the second dielectric layers 221, 221B and 221T are a plurality of nitride layers.

As shown in FIG. 3A and FIG. 3B, the multi-layer 21 is patterned to form a plurality of first patterned stacks 21M-1 and spaces 23 vertically between the first patterned stacks 21M-1, wherein two adjacent first patterned stacks 21M-1 are separated by one space 23. In one embodiment, the spaces 23 expose the bottom layer 211B of the first dielectric layers. Also, five points a1, a2, a3, a4, a5 are labeled on FIG. 3A and FIG. 3B for clearly pointing out the relative positions of the first patterned stacks 21M-1 and the spaces 23.

According to the embodiment, one of the first patterned stacks 21M-1 has a width of F0, and one of the spaces 23 has a width of Fs, and F0 is larger than Fs. In one embodiment, F0 is equal to or more than 2 times Fs. In one embodiment, F0 is equal to three times Fs (F0/Fs=3).

Figure 4B:
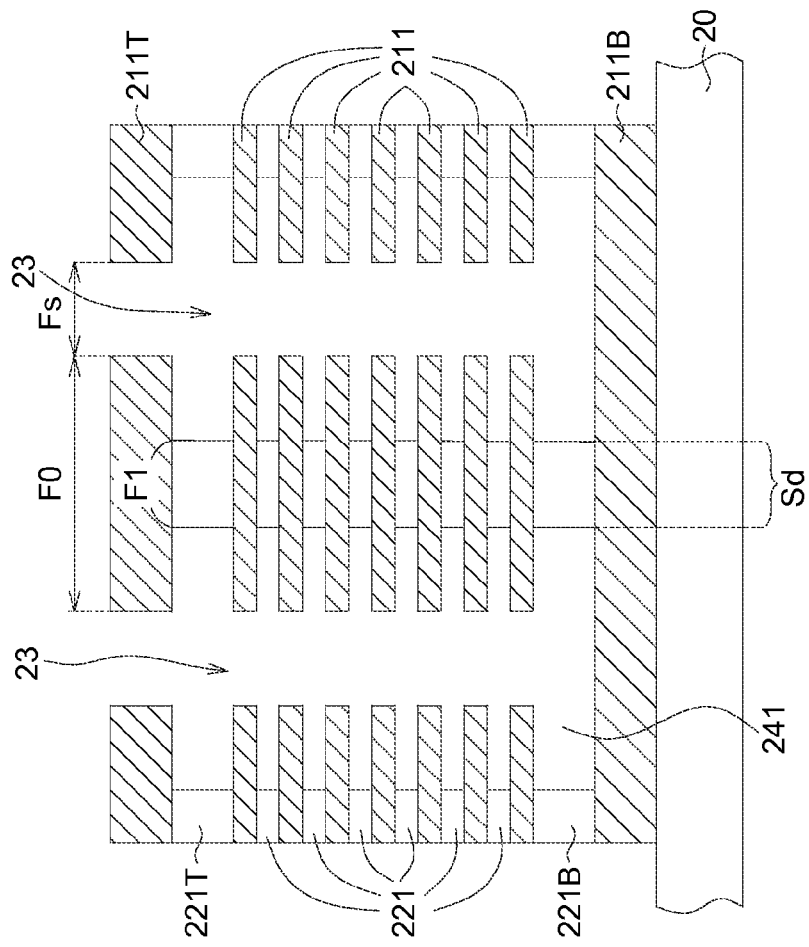
Figure 4A:
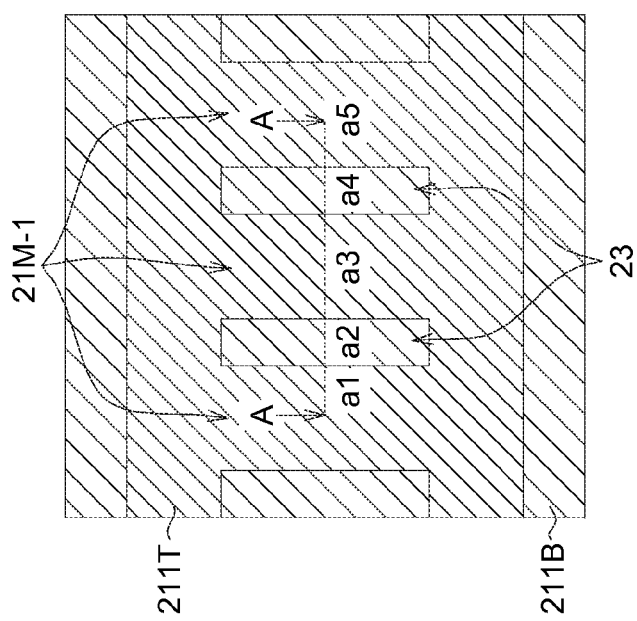

As shown in FIG. 4A and FIG. 4B, parts of the second dielectric layers 221, 221B and 221T of the first patterned stacks 21M-1 are removed, so as to form a plurality of first cavities 241 in the first patterned stacks 21M-1. According to the embodiment, after removing parts of the second dielectric layers 221, 221B and 221T, the remained parts of the second dielectric layers and the first dielectric layers in the first patterned stack 21M-1 constitute a dielectric support Sd with a width of F1. F1 can be larger than, equal to or less than Fs. In one embodiment, F1 is in a range of about 1/4 Fs to Fs. In one embodiment, F1 is substantially equal to Fs. Also, the dielectric support Sd can be substantially formed in a center of the first patterned stack 21M-1.

In one embodiment, the second dielectric layers 221, 221B and 221T of the first patterned stacks 21M-1 are nitride layers, and can be partially removed by dipping the structure in a hot phosphoric (H3PO4) acidic solution to undercut the nitride to the width of F1. In practical applications, the dipping time of the H3PO4 solution can be adjusted depending on the concentration of the H3PO4 solution and the requirements of remained width of the second dielectric layers.

Figures 5A, 5B:
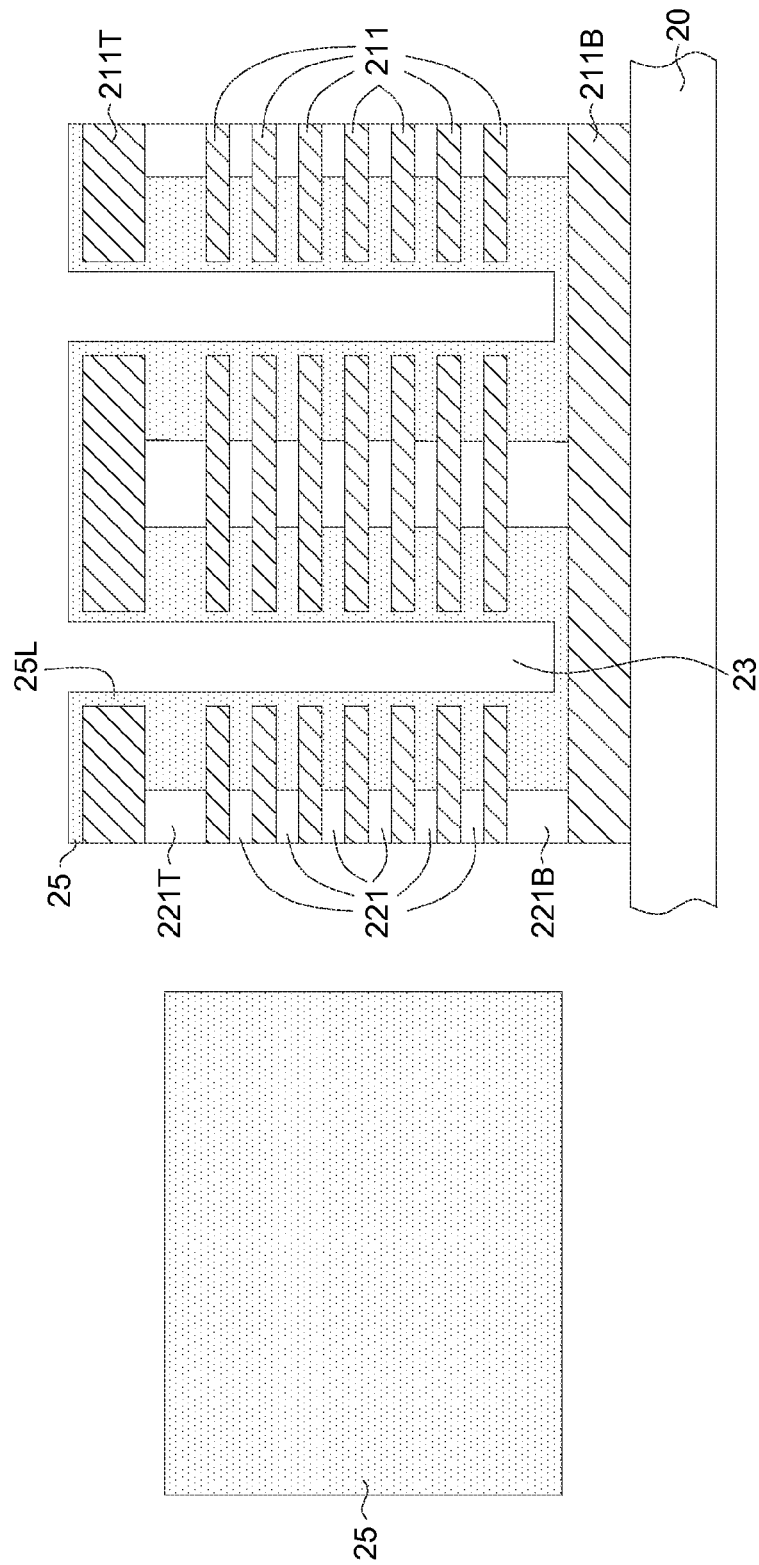

After partial removal of the second dielectric layers 221, 221B and 221T of the first patterned stacks 21M-1, the step of filling the first cavities 241 in the first patterned stacks 21M-1 with first conductors 251 is conducted. FIG. 5B and FIG. 6B illustrate one of applicable procedures.

In one embodiment, a conductive layer 25 (heavily (N+ or P+, P+ preferred) doped polysilion layer to reduce WL resistance), such as a polysilicon layer, is deposited on the substrate 20 to seal the undercut region. As shown in FIG. 5A and FIG. 5B, the conductive layer 25 fills up the first cavities 241 of the first patterned stacks 21M-1 and forms the conductive liners 25L in the spaces 23. Afterward, the conductive layer 25 is patterned by removing the conductive liners 25L in the space 23 (and the portion on the top layer 211T of the first patterned stacks 21M-1 is also removed), thereby forming the first conductors 251 in the first cavities 241, as shown in FIG. 6A and FIG. 6B. In one embodiment, the conductive layer 25 is patterned by chemical dry etching (CDE) to pull back the sidewalls of the conductors. It is shown in FIG. 6B that the sidewalls 251s of the first conductors 251 are substantially aligned with the edges of the first patterned stack 21M-1. Also, eight points a1~a8 are labeled on FIG. 6A and FIG. 6B for clearly pointing out the relative positions of the second dielectric layers, the first conductors 251 and the spaces 23.

As shown in FIG. 6B, the spaces 23 are formed between the first patterned stacks 21M-1, and one of the first patterned stacks 21M-1 comprises a dielectric support Sd sandwiched between two multi-layered pillars Pm. Each of the multi-layered pillars Pm comprises plural first dielectric layers 211, 211B and 211T and plural first conductors 251 (ex: polysilicon) arranged alternately. The dielectric support Sd comprises plural first dielectric layers 211, 211B and 211T and plural second dielectric layers 221, 221B and 221T arranged alternately.

According to the method of the embodiment, a multi-layer comprising a plurality of compressive and tensile dielectric layers arranged alternately is formed for sustaining the stress during the patterning step for forming the first patterned stacks 21M-1, and parts of the tensile dielectric layers of the first patterned stacks 21M-1 are then replaced by conductors. The method of the embodiment not only solves the bended and/or collapsed problem easily occurring in the stacking and patterning procedures for manufacturing the conventional stacked semiconductor structure, but also provides a self-aligned process (ex. obtaining the vertical sidewalls of the multi-layered pillars Pm). The method of the embodiment is especially suitable for manufacturing the 3D stacked semiconductor structure with high and thin patterned multi-layered pillars Pm.

After forming the multi-layered pillars and the dielectric supports Sd of FIG. 6B, the charge-trapping layer and the bit lines can be manufactured subsequently. FIG. 7A and FIG. 7B illustrate the charge-trapping layer and the bit lines manufactured by the method according to an embodiment of the present disclosure. FIG. 7A shows the top view of the embodied semiconductor structure. FIG. 7B illustrates the cross-sectional view along the cross-sectional line AA of FIG. 7A.

As shown in FIG. 7A and FIG. 7B, a charge-trapping layer 26, such as an ONO layer or an ONONO layer, is formed as a liner of one of the spaces 23, and plural bit lines BL are formed on the first patterned stacks 21M-1 and deposited in the spaces 23 for contacting the charge-trapping layer 26 in the spaces 23 according to one embodiment. As shown in FIG. 7A, the first patterned stacks 21M-1 extend along a first direction, such as y-direction, and the bit lines BL extend along a second direction, such as x-direction, wherein the second direction is perpendicular to the first direction. It is also indicated in FIG. 7A that the bit lines BL are spaced apart from each other and cross over the first patterned stacks 21M-1.

Also, the structures of bit lines BL and the spaces 23 can be adjusted and modified according to the requirements of the applications. For example, the material of the bit lines BL can fully fill the spaces 23 as shown in FIG. 7B for the application in DGVC process, and can partially fill the spaces 23 (such as deposited as a conductive liner and leaving a hollow inside) for the application in IDGVC process. The disclosure is not limited to one particular kind.

After forming the bit lines BL of FIG. 7B, the word lines (WL) in the pad region can be manufactured subsequently. FIG. 8A~FIG. 12A and FIG. 8B~FIG. 12B illustrate a method for manufacturing a 3D stacked semiconductor structure with pad regions according to an embodiment of the present disclosure. FIG. 8A~FIG. 12A show the top views of the embodied semiconductor structures. FIG. 8B~FIG. 12B illustrate the cross-sectional views along the cross-sectional line BB of FIG. 8A. Also, five points b1~b5 are labeled on FIG. 8A and FIG. 8B for clearly pointing out the relative positions of the second patterned stacks 21M-2 and the pad region 32.

Figures 8A, 8B:
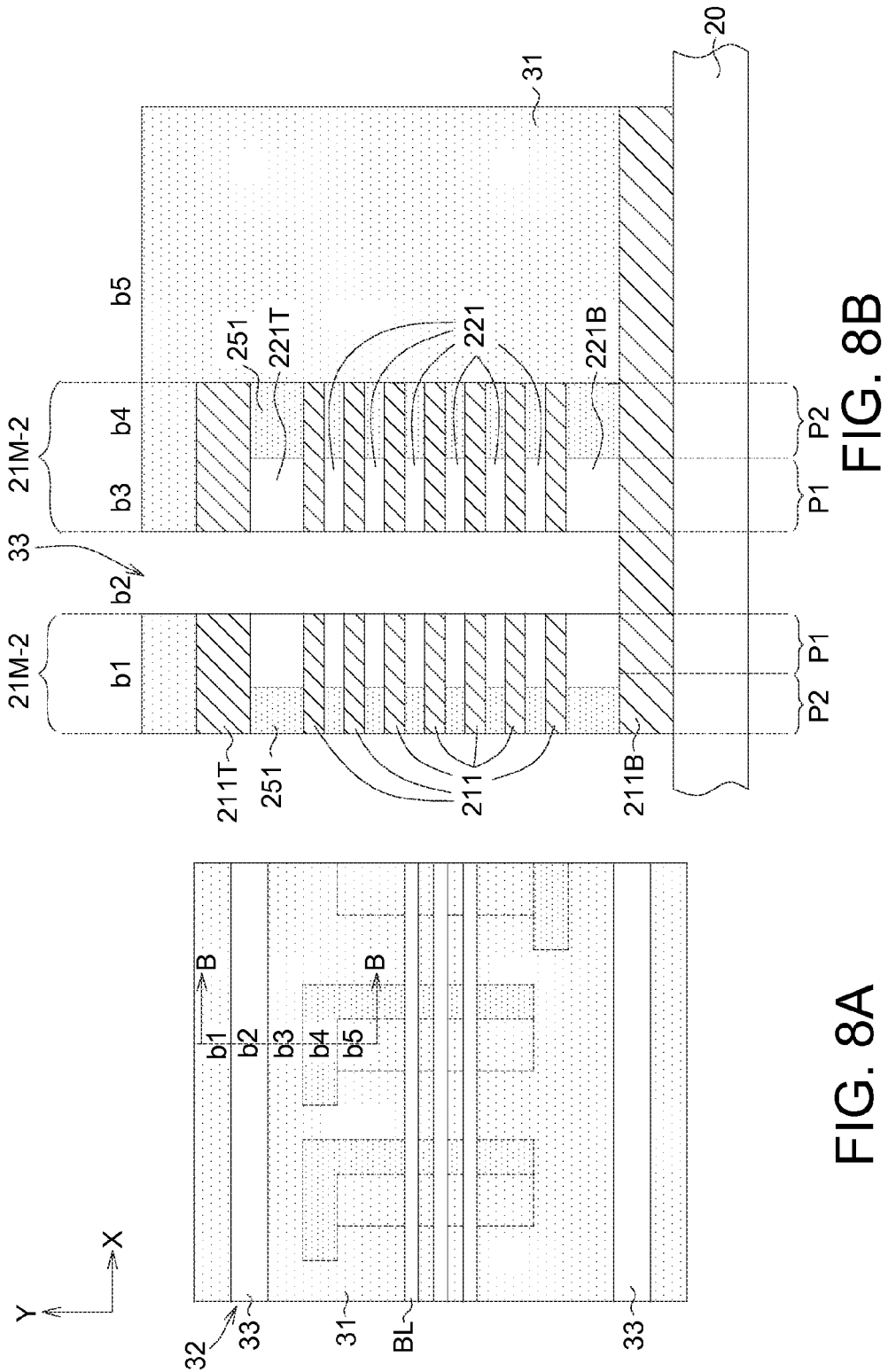

In one embodiment, an array area of the substrate 20 (such as bit line spaces) is sealed by a first insulating layer 31, such as an oxide layer. As shown in FIG. 8A and FIG. 8B, the pad regions 32 are outside the first patterned stacks 21M-1. A trench 33 is then formed at the pad region 32 to form the second patterned stacks 21M-2, and two of the second patterned stacks 21M-2 are adjacent to the trench 33, and the trench 33 extends along the second direction, such as x-direction.

In one embodiment, each of the second patterned stacks 21M-2 comprises a first pillar P1 and a second pillar P2 as shown in FIG. 8B. The first pillar P1 includes the first dielectric layers (such as oxide, 211, 211B and 211T) and the second dielectric layers (such as nitride (ex: SiN), 221, 221B and 221T) arranged alternately, and the trench 33 exposes a bottom layer 211B of the first dielectric layers, wherein the first pillars P1 of the second patterned stacks 21M-2 are adjacent to the trench 33. The second pillar P2 includes the first dielectric layers (such as oxide, 211, 211B and 211T) and the first conductors 251 arranged alternately.

As shown in FIG. 9A and FIG. 9B, the second dielectric layers (such as nitride (ex: SiN), 221, 221B and 221T) of the first pillars P1 of the second patterned stacks 21M-2 adjacent to the trench 33 are removed, so as to form a plurality of second cavities 242 in the second patterned stacks 21M-2. Similarly, the second dielectric layers 221, 221B and 221T, such as nitride (ex: SiN), can be removed by dipping in a hot H3PO4 solution, thereby exposing the first conductors 251 of the second pillar P2.

Figures 10A, 10B:
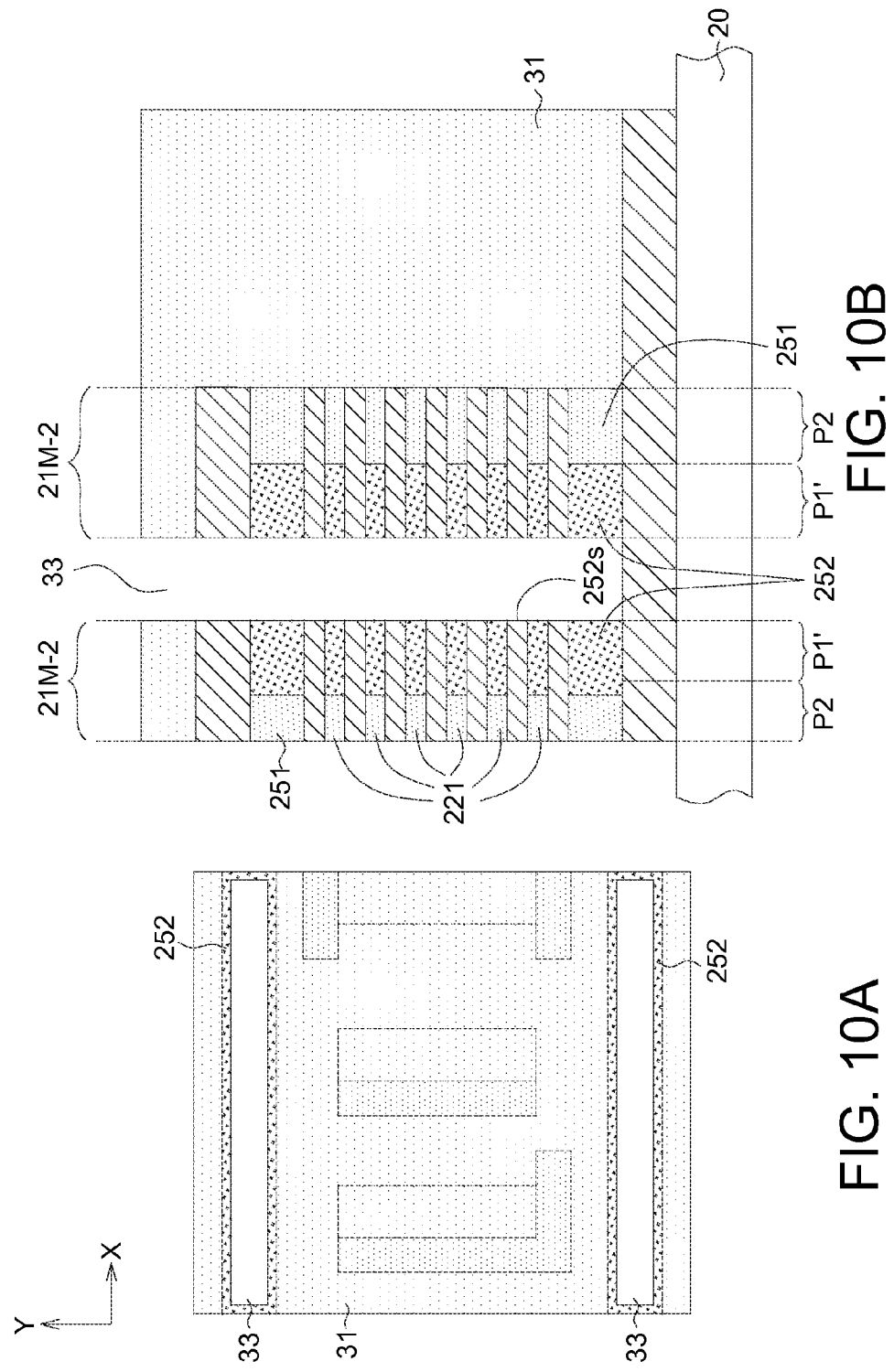

As shown in FIG. 10A and FIG. 10B, the second cavities 242 in the second patterned stacks 21M-2 are filled with second conductors 252, wherein the sidewalls 252s of the second conductors 252 are substantially aligned with the edges of the second patterned stacks 21M-2. Similarly, a conductive layer can be deposited for sealing the second cavities 242, followed by RIE (reactive-ion etching) or by chemical dry etching (CDE) pulling back to form the structure of FIG. 10B.

In one embodiment, the material of the second conductors 252 comprises metals (such as TiN/W) or polysilicon (such as heavily doped polysilicon). Material of the second conductors 252 can be determined according to the actual needs of the applications, for example, the second conductors 252 can be P+ polysilicon for the BSONOS device. Also, the first conductors 251 of the second pillar P2 and the second conductors 252 of the first pillars P1' may comprise the same material; for example, both of the first conductors 251 and the second conductors 252 are made of P+ material for broadening the operation window.

Figures 11A, 11B:
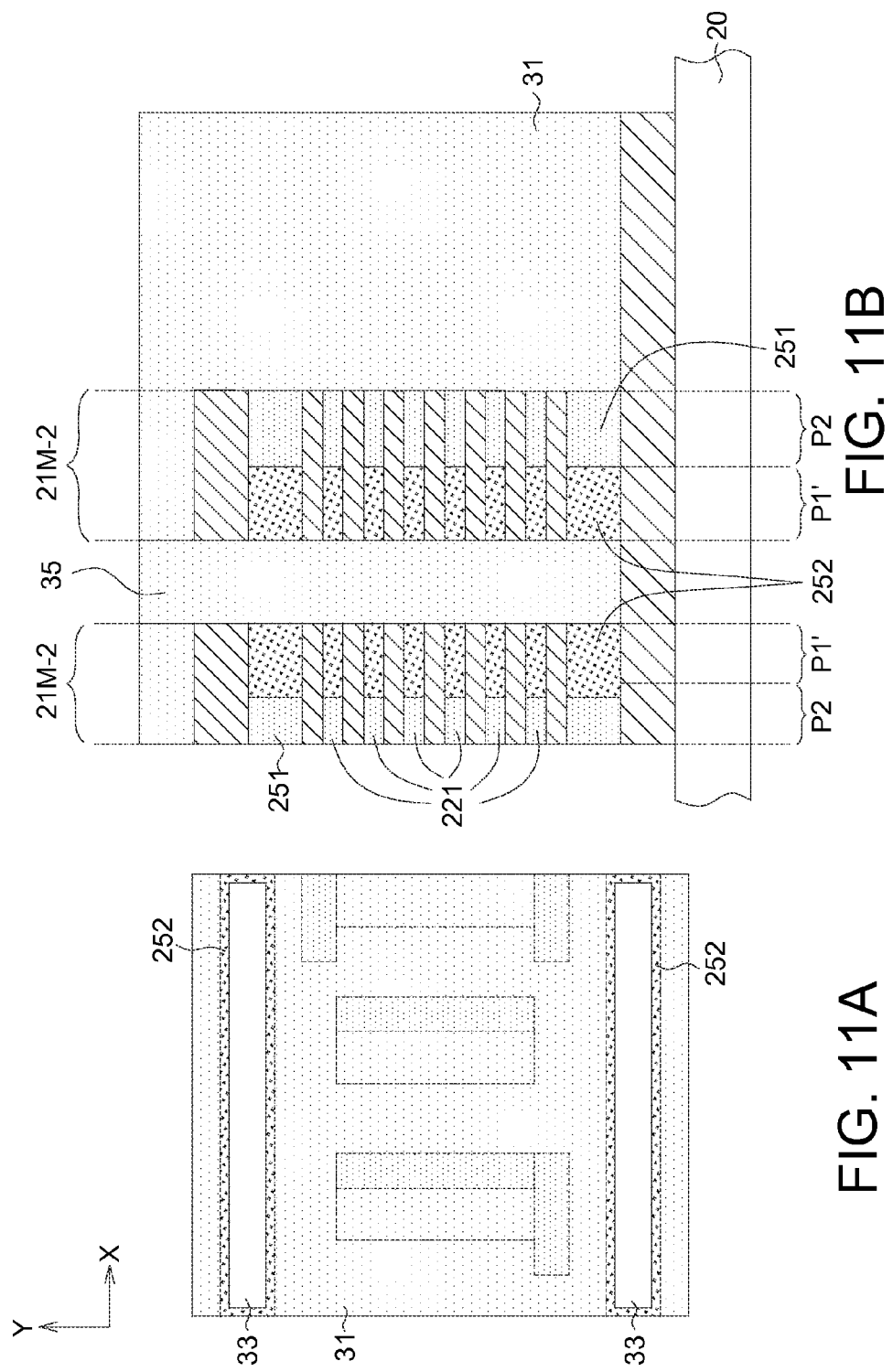
Figures 12A, 12B:
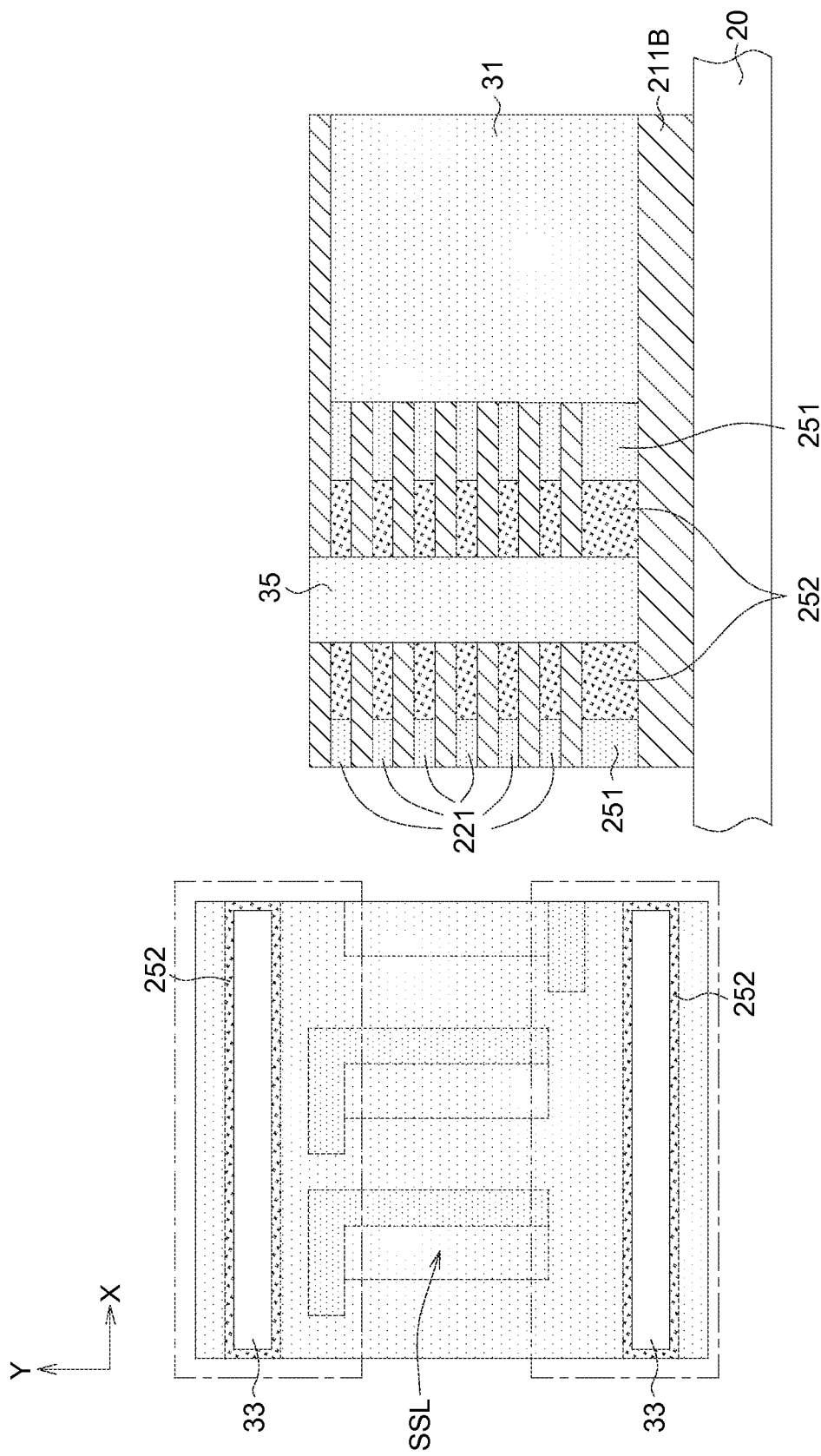

As shown in FIG. 11A and FIG. 11B, the trench 33 at the pad regions 32 is sealed by a second insulating layer 35. In one embodiment, the second insulating layer 35 can be an oxide layer. In one embodiment, the second insulating layer 35 and the first insulating layer 31 comprises the same material.

According to the descriptions above, the multi-layered pillars Pm, the dielectric supports Sd (as shown in FIG. 6B), and the bit line BL (as shown in FIG. 7B) have been fabricated. Also, FIG. 11B could be the cross-sectional view of the SSL (string selective line) structure (i.e. having the top layer 211T of the first dielectric layer and the top layer 221T of the second dielectric layer). According to the embodiment, no SSL is observed at the WL pad region 32. A top portion at the pad region 32 is removed, and the top portion comprises a top layer 211T of the first dielectric layer of the first pillars P1' and the second pillars P2, and a top conductor of the first conductors 251 of the second pillars P2, and a top conductor of the second conductors 252 of the first pillars P1'.

Figure 13:
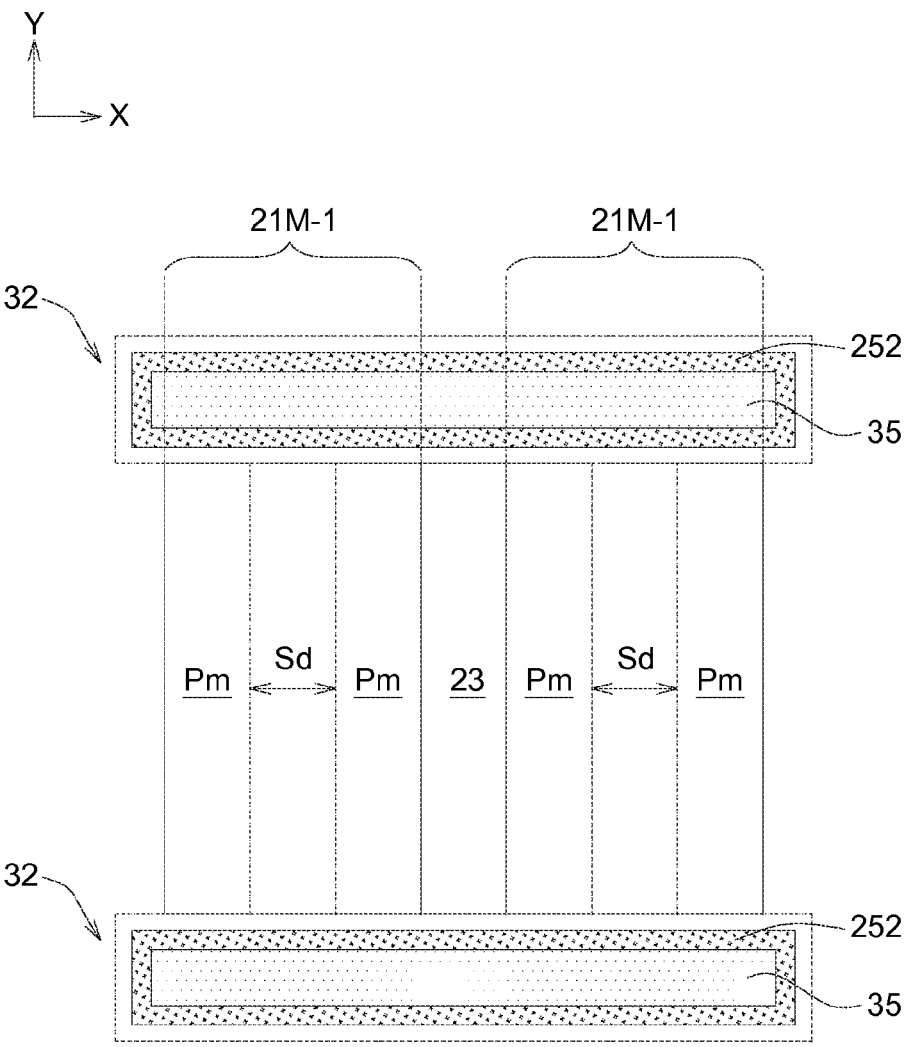
FIG. 13 illustrates one of the 3D stacked semiconductor structures manufactured according to an embodiment of the present disclosure.

FIG. 13 illustrates one of the 3D stacked semiconductor structures manufactured according to an embodiment of the present disclosure. A 3D stacked semiconductor structure at least comprises plural first patterned stacks 21M-1 formed on a substrate, plural spaces 23 formed between the first patterned stacks 21M-1, and a pad region 32 outside the first patterned stacks 21M-1 and electrically connected to the multi-layered pillars Pm. Each of the first patterned stacks 21M-1 includes two multi-layered pillars Pm and a dielectric support Sd sandwiched between the two multi-layered pillars Pm. Please also refer to FIG. 6B for the cross-sectional details of the multi-layered pillar Pm and the dielectric support Sd. Each of the multi-layered pillars Pm comprises plural first dielectric layers 211, 211B and 211T and plural first conductors 251 (ex: polysilicon) arranged alternately. The dielectric support Sd comprises plural first dielectric layers 211, 211B and 211T and plural second dielectric layers 221, 221B and 221T arranged alternately. As shown in FIG. 13, the first patterned stacks 21M-1 extend along the first direction (i.e. y-direction), and the pad region 32 extends along a second direction (i.e. x-direction) perpendicular to the first direction. Also, the trench 33 filled with the second insulating layer 35 and surrounded by the second conductors 252 is formed at the pad region 32, and the details and other relative components have been described above and not redundantly repeated here.

According to the structure of FIG. 13, a dielectric support Sd is also formed for providing physical support for two adjacent multi-layered pillars Pm of the first patterned stack 21M-1, thereby strengthening the overall construction. Therefore, the 3D stacked semiconductor structures manufactured according to the embodiment is solid and not easy-to-bended or collapsed, especially when the structure in the application requires forming high and thin patterned multi-layered pillars.

According to the aforementioned descriptions, a multi-layer comprising plural first dielectric layers and second dielectric layers arranged alternately are formed on the substrate, followed by patterning the multi-layer to form plural first patterned stacks and spaces between the first patterned stacks. According to the embodiment, the first dielectric layers are compressive layers exhibiting compressive stress, and the second dielectric layers are tensile layers exhibiting tensile stress. Therefore, the method of the embodiment solves easy-to-bended and/or collapsed problem occurring in the stacking and patterning procedures for manufacturing the conventional stacked semiconductor structure. Parts of the second dielectric layers of one of the first patterned stacks are then removed and replaced by the conductors. The method of the embodiment also provides a self-aligned process, and vertical sidewalls of the multi-layered stacks can be obtained. Furthermore, the 3D stacked semiconductor structure of the embodiments are manufactured by simple process, and adopting no time-consuming and expensive procedures. Moreover, the 3D stacked semiconductor structure manufactured by the method of the embodiment has plural multi-layered stacks and spaces between the multi-layered stacks, and each stack comprises a dielectric support sandwiched between two multi-layered pillars for providing physical support. Accordingly, the structure of the embodiments possesses a solid construction, a self-aligned profile, and reliable electrical characteristics. The method of the embodiment is especially suitable for manufacturing a 3D stacked semiconductor structure requiring high and thin patterned multi-layered pillars without causing bended or collapsed pillars.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of manufacturing a 3D stacked semiconductor structure, comprising:
    forming a multi-layer on a substrate, and the multi-layer comprising a plurality of first dielectric layers and second dielectric layers arranged alternately;
    patterning the multi-layer to form a plurality of first patterned stacks and spaces between the first patterned stacks, and the spaces exposing a top surface of a bottom layer of the first dielectric layers, wherein one of the first patterned stacks has a width of F0 while the one of the spaces has a width of Fs, and F0 is equal to or more than 2 times Fs;
    removing parts of the second dielectric layers of one of the first patterned stacks, so as to form a plurality of first cavities in said first patterned stack;
    filling the first cavities in said first patterned stack with first conductors forming a charge-trapping layer as a liner of one of the spaces; and
    forming a plurality of bit lines on the first patterned stacks and deposited in the spaces for contacting the charge-trapping layer in the spaces,
    wherein the first patterned stacks extend along a first direction, and the bit lines extend along a second direction perpendicular to the first direction, and wherein the bottom layer of the first dielectric layers of the multi-layer is directly formed on the substrate, and the substrate is completely covered by the bottom layer during formation of the first conductors.

2. The method according to claim 1, wherein the first dielectric layers are compressive layers exhibiting compressive stress, and the second dielectric layers are tensile layers exhibiting tensile stress.

3. The method according to claim 1, wherein the first dielectric layers are a plurality of oxide layers, and the second dielectric layers are a plurality of nitride layers.

4. The method according to claim 1, wherein F0 is equal to three times Fs.

5. The method according to claim 1, wherein remained parts of the second dielectric layers and the first dielectric layers in said first patterned stack constitute a dielectric support with a width of F1 after removing parts of the second dielectric layers.

6. The method according to claim 1, wherein step of filling the first cavities comprises:
    depositing a conductive layer on the substrate to fill the first cavities of the first patterned stacks and form a conductive liner in one of the spaces; and
    patterning the conductive layer by removing the conductive liner in said space, thereby forming the first conductors in the first cavities, wherein sidewalls of the first conductors are aligned with edges of said first patterned stack.

7. The method according to claim 1, further comprising:
    sealing an array area of the substrate by a first insulating layer;

forming a trench at a pad region outside the first patterned stacks to form two of second patterned stacks adjacent to the trench, and the trench extending along the second direction.

8. The method according to claim 7, wherein each of said second patterned stacks comprises:

a first pillar having the first and the second dielectric layers arranged alternately, and the trench exposing a bottom layer of the first dielectric layers; and a second pillar having the first dielectric layers and the first conductors arranged alternately, wherein the first pillars of said second patterned stacks are adjacent to the trench.

9. The method according to claim 8, further comprising:

removing the second dielectric layers of the first pillars of said second patterned stacks adjacent to the trench, so as to form a plurality of second cavities in said second patterned stacks;

filling the second cavities in said second patterned stacks with second conductors, wherein sidewalls of the second conductors are substantially aligned with edges of said second patterned stacks; and sealing the trench by a second insulating layer.

* * * * *